United States Patent
Saji et al.

(10) Patent No.: US 11,817,493 B2
(45) Date of Patent: Nov. 14, 2023

(54) SEMICONDUCTOR DEVICE

(71) Applicant: Murata Manufacturing Co., Ltd., Kyoto-fu (JP)

(72) Inventors: Mari Saji, Nagaokakyo (JP); Atsushi Kurokawa, Nagaokakyo (JP); Koshi Himeda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 155 days.

(21) Appl. No.: 17/545,973

(22) Filed: Dec. 8, 2021

(65) Prior Publication Data
US 2022/0181470 A1 Jun. 9, 2022

(30) Foreign Application Priority Data
Dec. 9, 2020 (JP) ................................. 2020-204469

(51) Int. Cl.
*H01L 29/737* (2006.01)
*H01L 23/00* (2006.01)
*H01L 29/66* (2006.01)

(52) U.S. Cl.
CPC ............ *H01L 29/737* (2013.01); *H01L 24/13* (2013.01); *H01L 29/66242* (2013.01); *H01L 29/66318* (2013.01); *H01L 2224/0401* (2013.01)

(58) Field of Classification Search
CPC . H01L 29/737; H01L 24/13; H01L 29/66242; H01L 29/66318; H01L 2224/0401; H01L 2224/11; H01L 2224/13; H01L 27/0823; H01L 29/205; H01L 29/7371; H01L 23/562
See application file for complete search history.

(56) References Cited

U.S. PATENT DOCUMENTS

2018/0062586 A1* 3/2018 Sasaki .................. H01L 27/082
2019/0172807 A1 6/2019 Kurokawa et al.

FOREIGN PATENT DOCUMENTS

JP 2019-149485 A 9/2019

* cited by examiner

*Primary Examiner* — Syed I Gheyas
(74) *Attorney, Agent, or Firm* — Studebaker & Brackett PC

(57) ABSTRACT

A semiconductor device includes a substrate having an upper surface on which are arranged first transistors each including a mesa structure formed of a semiconductor. A first bump having a shape elongated in one direction in plan view and connected to the first transistors is arranged at a position overlapping the first transistors in plan view. A second bump has a space with respect to the first bump in a direction orthogonal to a longitudinal direction of the first bump. A first metal pattern is arranged between the first and second bumps in plan view. When the upper surface of the substrate is taken as a height reference, a center of the first metal pattern in a thickness direction has a height higher than an upper surface of the mesa structure included in each of the first transistors and lower than a lower surface of the first bump.

20 Claims, 12 Drawing Sheets

SEMICONDUCTOR DEVICE

CROSS-REFERENCE TO RELATED APPLICATION

This application claims benefit of priority to Japanese Patent Application No. 2020-204469, filed Dec. 9, 2020, the entire content of which is incorporated herein by reference.

BACKGROUND

Technical Field

The present disclosure relates to semiconductor devices.

Background Art

As a transistor configuring a power amplifier module of a portable terminal or the like, for example, a heterojunction bipolar transistor (HBT) is used. This power amplifier module is generally flip-chip-mounted on a module substrate. Also, to enhance flexibility in the design of the position of a bump, a so-called redistribution layer is used.

To efficiently conduct heat occurring at the HBT to the module substrate, a bump connected to the HBT is arranged straight above the HBT. This bump functions as a heat-transfer route from the HBT to the module substrate. In solder reflow process when this power amplifier module is mounted on the module substrate, thermal stress occurs. With the HBT arranged straight below the bump, thermal stress tends to be applied to the HBT and the vicinity thereof, and thus a crack tends to occur at the HBT and the vicinity thereof. This crack becomes a factor in decreasing reliability of the power amplifier module. In the semiconductor device disclosed in Japanese Unexamined Patent Application Publication No. 2019-149485, stress applied to the HBT and the vicinity thereof is mitigated by arranging a stress mitigation layer under each wire included in the redistribution layer.

SUMMARY

To enhance reliability of the semiconductor device, it is desirable to further decrease thermal stress applied to a semiconductor element such as the HBT included in the semiconductor device. Accordingly, the present disclosure provides a semiconductor device capable of decreasing thermal stress applied to the semiconductor element.

According to an aspect of the present disclosure, there is provided a semiconductor device including: a substrate; a plurality of first transistors each including a mesa structure formed of a semiconductor arranged on an upper surface, which is one surface of the substrate; a first bump which is arranged at a position overlapping the plurality of first transistors in plan view, has a shape elongated in one direction in plan view, and is connected to the plurality of first transistors; a second bump which is arranged so as to have a space with respect to the first bump in a direction orthogonal to a longitudinal direction of the first bump; and a first metal pattern which is arranged between the first bump and the second bump in plan view. When the upper surface of the substrate is taken as a height reference, a center of the first metal pattern in a thickness direction has a height higher than an upper surface of the mesa structure included in each of the plurality of first transistors and lower than a lower surface of the first bump.

According to another aspect of the present disclosure, there is provided a semiconductor device including: a substrate; a plurality of first transistors each including a mesa structure formed of a semiconductor arranged on an upper surface, which is one surface of the substrate; and a first bump which is arranged at a position overlapping the plurality of first transistors in plan view, has a shape elongated in one direction in plan view, and is connected to the plurality of first transistors. The first bump and an area obtained by extending the first bump in a longitudinal direction are out of a geometric center of the substrate in plan view. The semiconductor device further includes a first metal pattern which is arranged in an area on a side of the geometric center from the first bump so as to have a space from the first bump in plan view. When the upper surface of the substrate is taken as a height reference, a center of the first metal pattern in a thickness direction has a height higher than an upper surface of the mesa structure included in each of the plurality of first transistors and lower than a lower surface of the first bump.

According to still another aspect of the present disclosure, there is provided a semiconductor device including: a substrate; a plurality of first transistors each including a mesa structure formed of a semiconductor arranged on an upper surface, which is one surface of the substrate; a first bump which is arranged at a position overlapping the plurality of first transistors in plan view, has a shape elongated in one direction in plan view, and is connected to the plurality of first transistors; a second bump which is arranged so as to have a space with respect to the first bump in a direction orthogonal to a longitudinal direction of the first bump; and a first metal pattern which is arranged between the first bump and the second bump in plan view. When the upper surface of the substrate is taken as a height reference, a center of the first metal pattern in a thickness direction has a height higher than an upper surface of the mesa structure included in each of the plurality of first transistors and lower than a lower surface of the first bump. As to the longitudinal direction of the first bump, the first metal pattern occupies a range that is ½ or more of a range where the first bump is arranged.

The first metal pattern mitigates thermal stress applied to the first transistor. This allows the occurrence of a crack due to thermal stress to be suppressed, enhancing reliability of the semiconductor device.

DETAILED DESCRIPTION

First Embodiment

Figure 1:
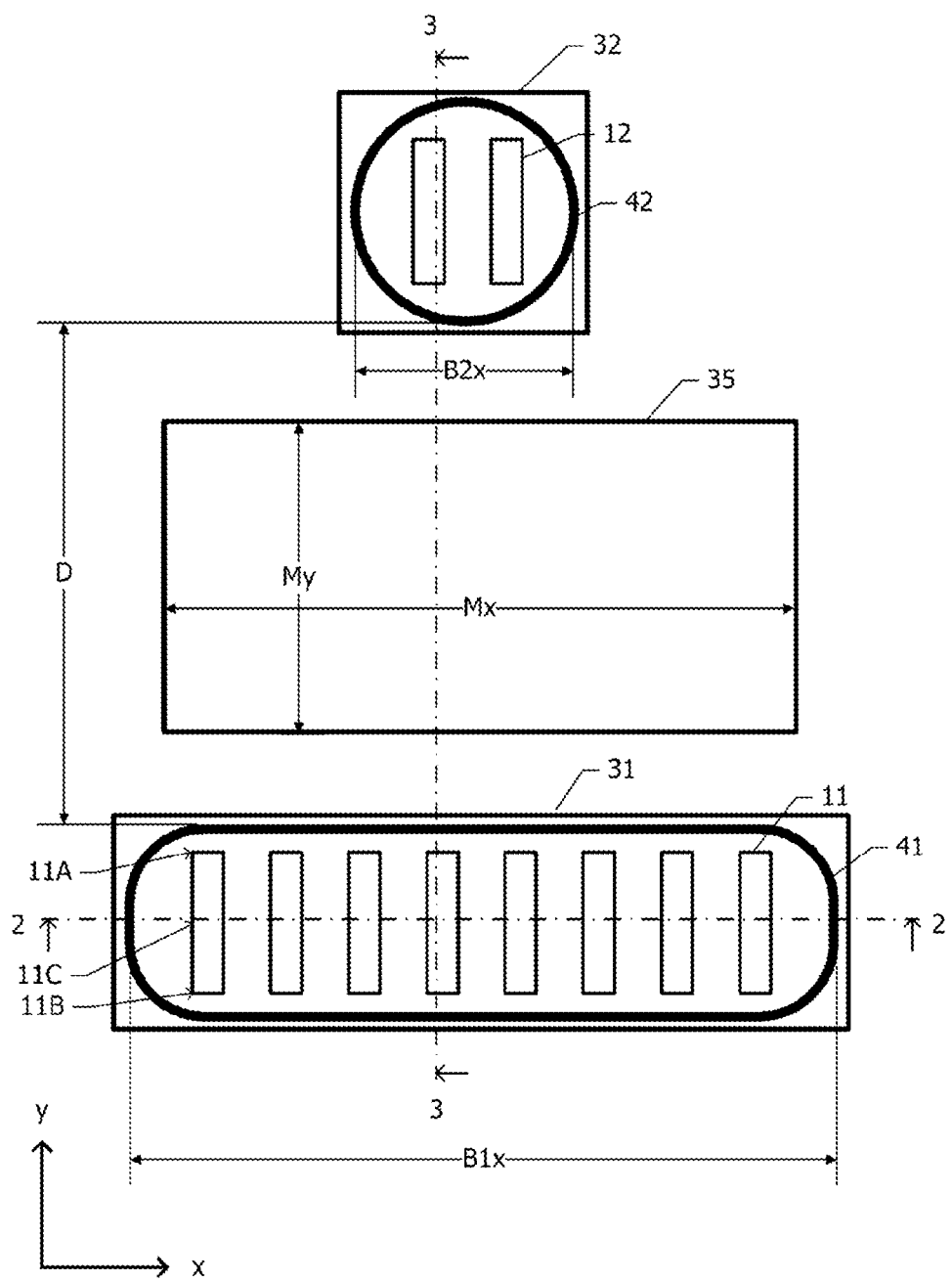
FIG. 1 is a diagram depicting a planar position relation among main components of a semiconductor device according to a first embodiment.
Figure 2:
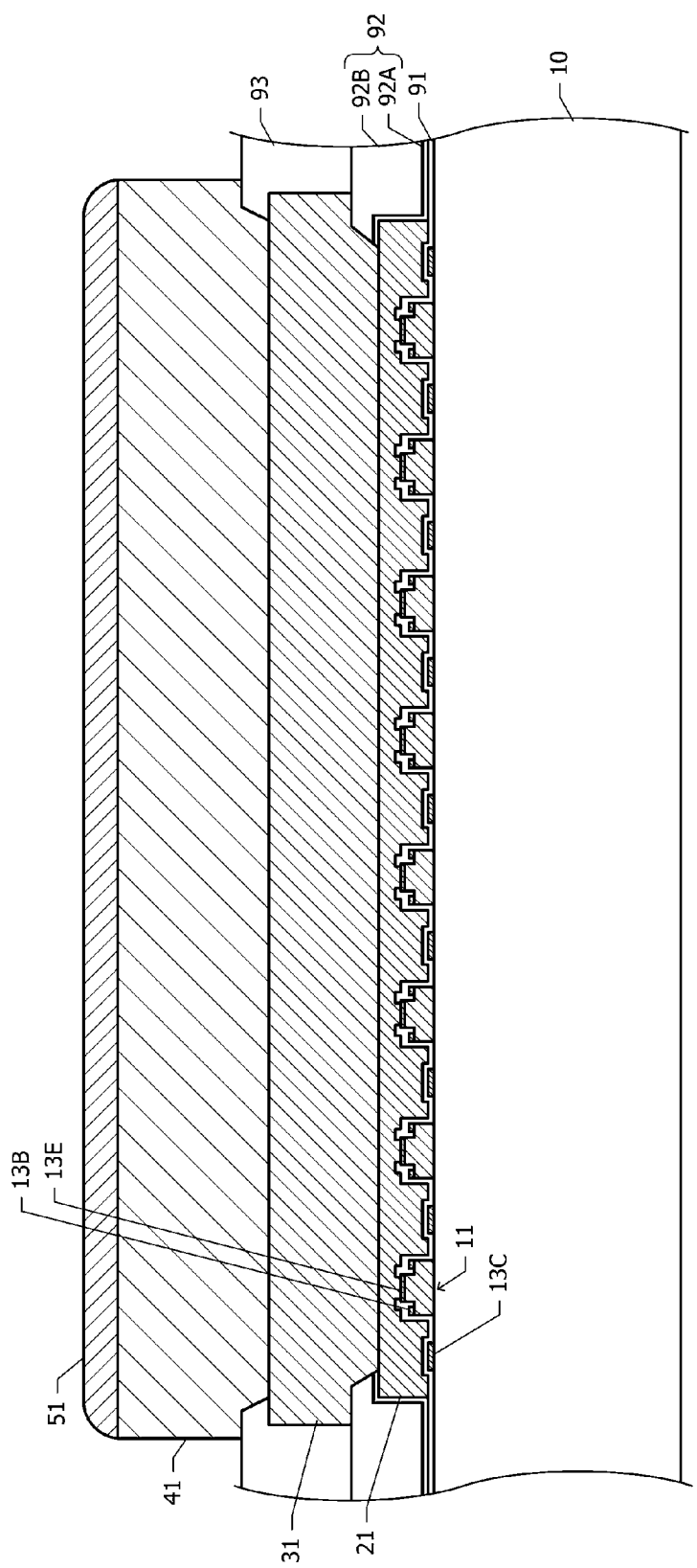
FIG. 2 is a sectional view of FIG. 1 along a one-dot-chain line 2-2.
Figure 3:
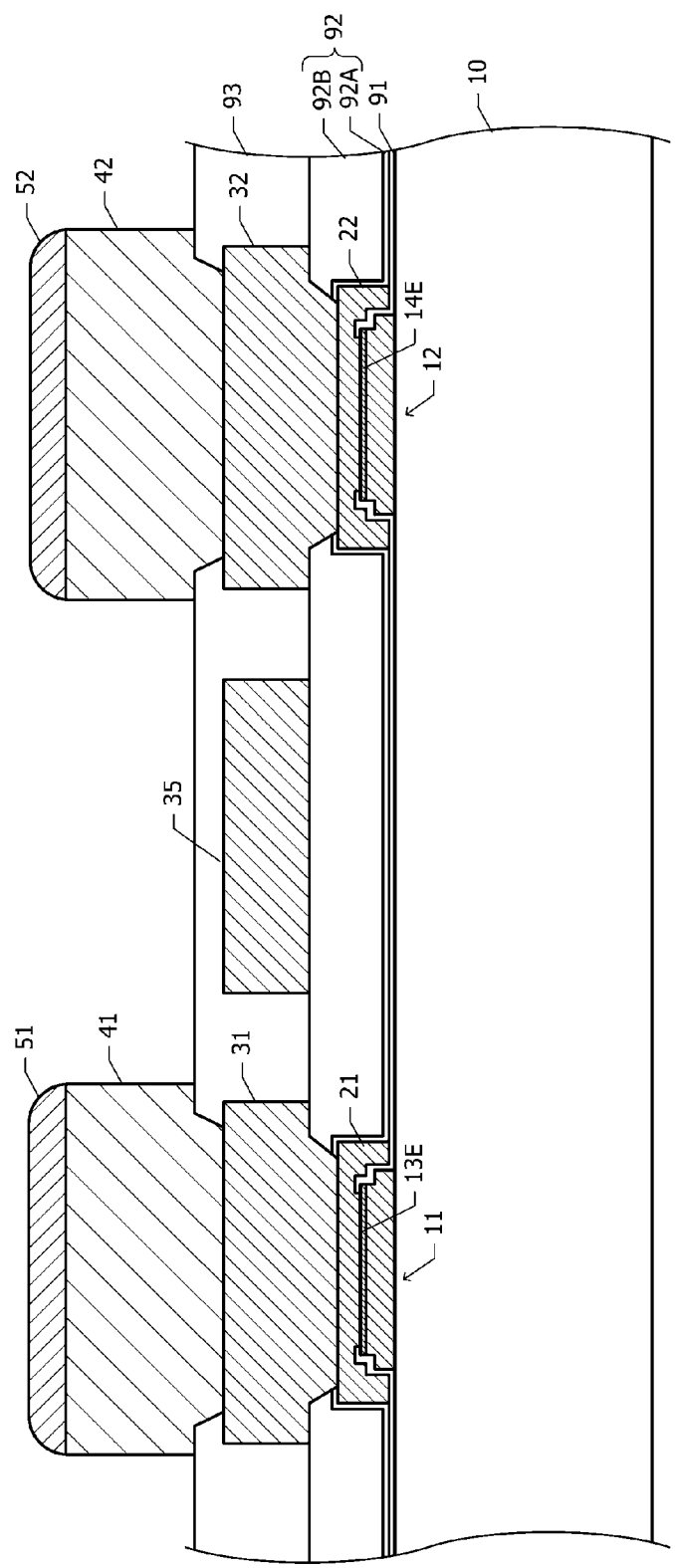
FIG. 3 is a sectional view of FIG. 1 along a one-dot-chain line 3-3.

With reference to FIG. 1, FIG. 2, and FIG. 3, a semiconductor device according to a first embodiment is described.

FIG. 1 is a diagram depicting a planar position relation among main components of the semiconductor device according to the first embodiment. On one surface (hereinafter referred to as an upper surface) of a substrate, a plurality of first transistors 11 and two second transistors 12 are arranged. Note that the number of second transistors 12 is not limited to two. Only one second transistor 12 may be arranged, and three or more second transistors 12 may be arranged.

The plurality of first transistors 11 are arranged as aligned in one direction. On the upper surface of the substrate, an xy orthogonal coordinate system is defined in which the direction of the array of the first transistors 11 is defined as an x direction. The plurality of first transistors 11 each have a shape elongated in a y direction in plan view. The two second transistors 12 are arranged also as aligned in the x direction. Also, the second transistors 12 each have a shape elongated in the y direction in plan view.

A first pad 31 and a first bump 41 are arranged so as to cover the plurality of first transistors 11 in plan view. The first pad 31 and the first bump 41 each have a shape elongated in the x direction in plan view. The first bump 41 is arranged over a range B1x as to the x direction.

A second pad 32 and a second bump 42 are arranged so as to have a space with respect to the first bump 41 in the y direction. The space between the first bump 41 and the second bump 42 in the y direction is represented as D. The second bump 42 is arranged over a range B2x as to the x direction. The second pad 32 and the second bump 42 overlap each other in plan view. Furthermore, the second pad 32 and the second bump 42 cover the two second transistors 12 in plan view.

The plurality of first transistors 11 are connected in parallel to each other, and the two second transistors 12 are connected also in parallel to each other. The plurality of first transistors 11 and the two second transistors 12 configure a high-frequency amplifier circuit in a two-stage structure. The two second transistors 12 configure a first-stage amplifier circuit, and the plurality of first transistors 11 configure a final-stage amplifier circuit.

A first metal pattern 35 is arranged between the first bump 41 and the second bump 42 in plan view. The first metal pattern 35 is arranged over a range Mx as to the x direction, and is arranged over a range My as to the y direction. With reference to the first bump 41, on a side opposite to a side where the second bump 42 is arranged, no bump covering a mesa structure provided on the upper surface of a substrate 10 in plan view is arranged.

FIG. 2 and FIG. 3 are sectional views of FIG. 1 along a one-dot-chain line 2-2 and a one-dot-chain line 3-3, respectively. On the upper surface of the substrate 10, the plurality of first transistors 11 (FIG. 2 and FIG. 3) and the two second transistors 12 (FIG. 3) are arranged. Note that one first transistor 11 and one second transistor 12 appear on the section depicted in FIG. 3. The first transistors 11 and the second transistors 12 each have a mesa structure formed of a semiconductor provided on the upper surface of the substrate 10. The mesa structure includes a collector layer, a base layer, and emitter layer laminated sequentially from a substrate side. The collector layer, the base layer, and the emitter layer are formed of, for example, n-type GaAs, p-type GaAs, and n-type InGaP. That is, the first transistor 11 is a heterojunction bipolar transistor.

The substrate 10 is formed of a compound semiconductor, for example, semi-insulating GaAs, and includes, in part of the area of its surface layer part, an n-type semiconductor layer applied with n-type conductivity. A collector electrode 13C is arranged at each of positions which interpose each of the first transistors 11 in the direction of the array of the first transistors 11. The collector electrode 13C is electrically connected to the collector layer via the n-type semiconductor layer of the surface layer part of the substrate 10.

A base electrode 13B and an emitter electrode 13E are arranged on the mesa structure of each of the plurality of first transistors 11. The base electrode 13B and the emitter electrode 13E are electrically connected to the base layer and the emitter layer, respectively, of the first transistor 11. Also similarly on each second transistor 12, a collector electrode, a base electrode, and an emitter electrode 14E (FIG. 3) are provided. Note that the collector electrode and the base electrode do not appear in the section depicted in FIG. 3.

An interlayer insulating film 91 of a first layer is arranged over the entire area of the upper surface of the substrate 10 so as to cover the collector electrode 13C, the base electrode 13B, and the emitter electrodes 13E and 14E. The interlayer insulating film 91 is formed of an inorganic insulating material such as silicon oxide or silicon nitride.

A wiring layer of the first layer is arranged on the interlayer insulating film 91. In the wiring layer of the first layer, a first emitter wire 21, a second emitter wire 22, and so forth are included. For the wiring layer of the first layer, for example, Au or a metal having Au as a principal component is used.

The first emitter wire 21 passes through a plurality of openings provided in the interlayer insulating film 91 to be connected to the emitter electrodes 13E of the plurality of first transistors 11. The emitter layers of the plurality of first transistors 11 are electrically connected to one another by the first emitter wire 21 of the first layer. The second emitter wire 22 passes through two openings provided in the interlayer insulating film 91 to be connected to the emitter electrodes 14E of the second transistors 12. The emitter layers of the two second transistors 12 are electrically connected to each other by the second emitter wire 22.

In the wiring layer of the first layer, in addition, a collector wire and a base wire respectively connected to the collector electrode 13C and the base electrode 13B of each first transistor 11, and so forth are included. Furthermore, in the wiring layer of the first layer, a collector wire and a base wire respectively connected to the collector electrode and the base electrode of each second transistor 12, and so forth are included.

An interlayer insulating film 92 of a second layer is arranged on the wiring layer of the first layer. The interlayer insulating film 92 of the second layer includes two layers, a lower layer 92A on a lower side and an upper layer 92B on an upper side. The lower layer 92A is formed of an inorganic insulating material such as, for example, silicon oxide or silicon nitride, and the upper layer 92B is formed of an organic insulating material such as polyimide. The surface of the upper layer 92B is planarized. Two openings respectively covered with the first emitter wire 21 and the second emitter wire 22 in plan view are provided in the interlayer insulating film 92 of the second layer.

A wiring layer of the second layer is arranged on the interlayer insulating film 92 of the second layer. The wiring layer of the second layer includes the first pad 31, the second pad 32, and the first metal pattern 35. For the wiring layer of the second layer, a low-resistance metal material such as, for example, Cu, Al, or Au is used.

The first pad 31 and the second pad 32 each pass through an opening provided in the interlayer insulating film 92 to be respectively connected to the first emitter wire 21 and the second emitter wire 22 of the first layer. The first metal pattern 35 is in an electrically floating state. When the upper surface of the substrate 10 is taken as a height reference, the height of the center of the first metal pattern 35 in a thickness direction is higher than the upper surface of the mesa structure of each of the first transistors 11 and the second transistors 12 and is lower than the lower surface of each of the first bump 41 and the second bump 42.

A protective film 93 is arranged on the wiring layer of the second layer. The protective film 93 is formed of an organic insulating material such as polyimide, and its surface is planarized. The protective film 93 is provided with two openings respectively covered with the first pad 31 and the second pad 32 in plan view. The first bump 41 and the second bump 42 are respectively arranged in the two openings provided in the protective film 93. The first bump 41 is connected to the first pad 31, and the second bump 42 is connected to the second pad 32. For the first bump 41 and the second bump 42, Cu, Au, a metal material having Cu or Au as a principal component, or the like is used.

It may be configured that the first bump 41 and the second bump 42 include an under-bump-metal layer for the purpose of improving close contactness and preventing diffusion. The under-bump-metal layer is arranged between a pillar portion having Cu or the like as a principal component and the first pad 31, the second pad 32, and the protective film 93. For the under-bump-metal layer, for example, Ti, TiW, Ni, or the like is used.

The first bump 41 and the second bump 42 each protrude upward from the upper surface of the protective film 93. Furthermore, they each spread from the edge of the opening to its peripheral area in plan view. Solder layers 51 and 52 are respectively arranged on the upper surfaces of the first bump 41 and the second bump 42. For the solder layers 51 and 52, for example, solder having Sn as a principal component is used. A diffusion prevention layer may be arranged between the first bump 41 and the solder layer 51 and between the second bump 42 and the solder layer 52 to prevent diffusion of the solder material into each bump. For the diffusion prevention layer, for example, Ni, Ti, W, or the like is used.

Next, excellent effects of the first embodiment are described.

Distributions of thermal stress occurring when the semiconductor devices according to the first embodiment and a comparative example are mounted on a module substrate were found by simulations. In the semiconductor device according to the comparative example, the first metal pattern 35 provided to the semiconductor device according to the first embodiment is omitted. The simulations were conducted on conditions that: the solder layers 51 and 52 and so forth are heated to 260° C. to be melted, with the semiconductor device placed to face the module substrate; solder is solidified when the temperature decreased to 210° C.; and then the temperature decreases to room temperature.

According to the results of the above-described simulations, in the semiconductor device according to the comparative example with the first metal pattern 35 not arranged, thermal stresses occurring at an end portion 11A on a second bump 42 side, its opposite end portion 11B, and a center 11C of the mesa structure of the first transistor 11 (FIG. 1) were 257 MPa, 156 MPa, and 172 MPa, respectively. By contrast, in the semiconductor device according to the first embodiment with the first metal pattern 35 arranged, thermal stresses occurring at the end portions 11A and 11B and the center 11C of the mesa structure of the first transistor 11 were 232 MPa, 160 MPa, and 172 MPa, respectively. Note that the simulation conditions are the same in the two simulations except for the presence or absence of the first metal pattern 35.

From these simulation results, it can be found that the thermal stress is relatively high at the end portion 11A on the second bump 42 side of the mesa structure of each of the plurality of first transistors 11. In particular, it turned out that thermal stress concentration is significant in a transistor straight below a bump elongated in one direction. This is because, in a process of mounting the semiconductor device on the module substrate, in the course of decrease in temperature after solder is solidified and the first bump 41 and the second bump 42 are mechanically fixed to the module substrate, thermal stress is applied from the module substrate via the first bump 41 and the second bump 42 to the semiconductor device.

The thermal stress occurring at the end portion 11A decreases from 257 MPa to 232 MPa by arranging the first metal pattern 35. In this manner, it can be found that thermal stress concentration is mitigated by arranging the first metal pattern 35 on an end portion 11A side where the thermal stress is relatively high. Note that the thermal stress at the end portion 11B increases from 156 MPa to 160 MPa by arranging the first metal pattern 35, but the thermal stress at the end portion 11B is lower than the thermal stress at the end portion 11A even after the increase in thermal stress.

In the first embodiment, by arranging the first metal pattern 35 on a side where thermal stress tends to concentrate when viewed from a transistor row formed of the plurality of first transistors 11, thermal stress applied to the first transistors 11 can be decreased. This can suppress the occurrence of a crack due to thermal stress and enhance reliability of the semiconductor device.

Also, since the first metal pattern 35 is in an electrically floating state, an excellent effect is acquired in which the operation of an electronic circuit provided on the substrate 10 tends not to receive an influence from the first metal pattern 35. Note that the first metal pattern 35 may have a potential dropped to the ground potential of the electronic circuit provided on the substrate 10. Also in this case, the excellent effect is acquired in which the operation of the electronic circuit provided on the substrate 10 tends not to receive the influence from the first metal pattern 35.

Next, the preferable position and size of the first metal pattern 35 to acquire a sufficient effect of the first embodiment are described.

In order to decrease the influence regarding thermal stress received by the first transistor 11 from the second bump 42, as to the x direction, the first metal pattern 35 is preferably arranged so that the range Mx where the first metal pattern 35 is arranged covers the range B2x where the second bump 42 is arranged. Also, as to the x direction, the first metal pattern 35 is preferably arranged so that the range Mx where the first metal pattern 35 is arranged occupies ½ or more of the range B1x where the first bump 41 is arranged.

As to the y direction, the first metal pattern 35 is preferably arranged so that the range My where the first metal pattern 35 is arranged occupies ½ or more of the space D between the first bump 41 and the second bump 42 in the y direction.

Figure 4A:
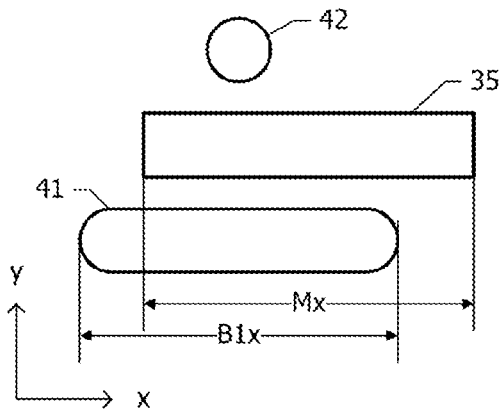
FIG. 4A, FIG. 4B, and FIG. 4C are diagrams depicting the arrangement and shapes of a first bump, a second bump, and a first metal pattern in semiconductor devices according to modifications of the first embodiment.
Figure 4B:
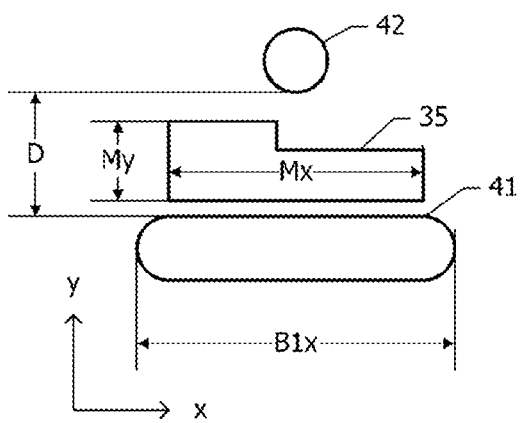
Figure 4C:
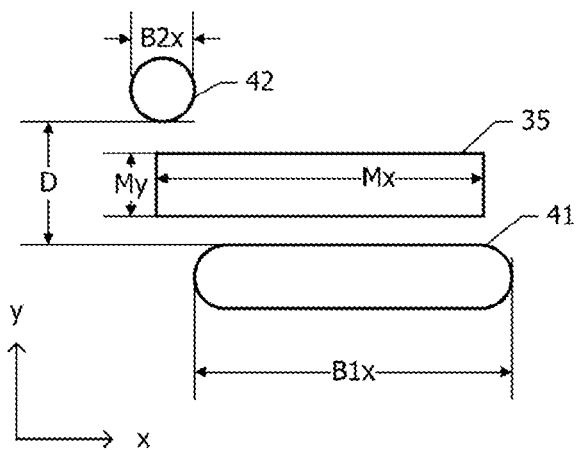

Next, with reference to FIG. 4A, FIG. 4B, and FIG. 4C, semiconductor devices according to modifications of the first embodiment are described. FIG. 4A, FIG. 4B, and FIG. 4C are diagrams depicting the arrangement and shapes of the first bump 41, the second bump 42, and the first metal pattern 35 in plan view in the semiconductor devices according to the modifications of the first embodiment.

In the modification depicted in FIG. 4A, as to the x direction, the first metal pattern 35 extends off the range B1x where the first bump 41 is arranged. In this case, as to the x direction, the first metal pattern 35 is preferably arranged so that an overlapping range of the range B1x where the first bump 41 is arranged and the range Mx where the first metal pattern 35 is arranged occupies ½ or more of the range B1x where the first bump 41 is arranged.

In the modification depicted in FIG. 4B, the shape of the first metal pattern 35 in plan view is an indefinite shape except for a square or a rectangle. As to the x direction, the first metal pattern 35 is arranged in the range B1x where the first bump 41 is arranged. Also in this case, the first metal pattern 35 is preferably arranged so that the range Mx where the first metal pattern 35 is arranged occupies ½ or more of the range B1x where the first bump 41 is arranged. Also as to the y direction, the first metal pattern 35 is preferably arranged so that the range My where the first metal pattern 35 is arranged occupies ½ or more of the space D.

In the modification depicted in FIG. 4C, as to the x direction, the second bump 42 is arranged at a position out of the range B1x where the first bump 41 is arranged. In this case, it is only required that a distance by which the second bump 42 is away from the first bump 41 in the y direction is defined as the space D therebetween. Also in this modification, as with the first embodiment, as to the y direction, the first metal pattern 35 is preferably arranged so that the range My where the first metal pattern 35 is arranged occupies ½ or more of the space D. Furthermore, as to the x direction, the first metal pattern 35 is preferably arranged so that an overlapping range of the range B2x where the second bump 42 is arranged and the range Mx where the first metal pattern 35 is arranged occupies ½ or more of the range B2x where the second bump 42 is arranged.

Figure 5:
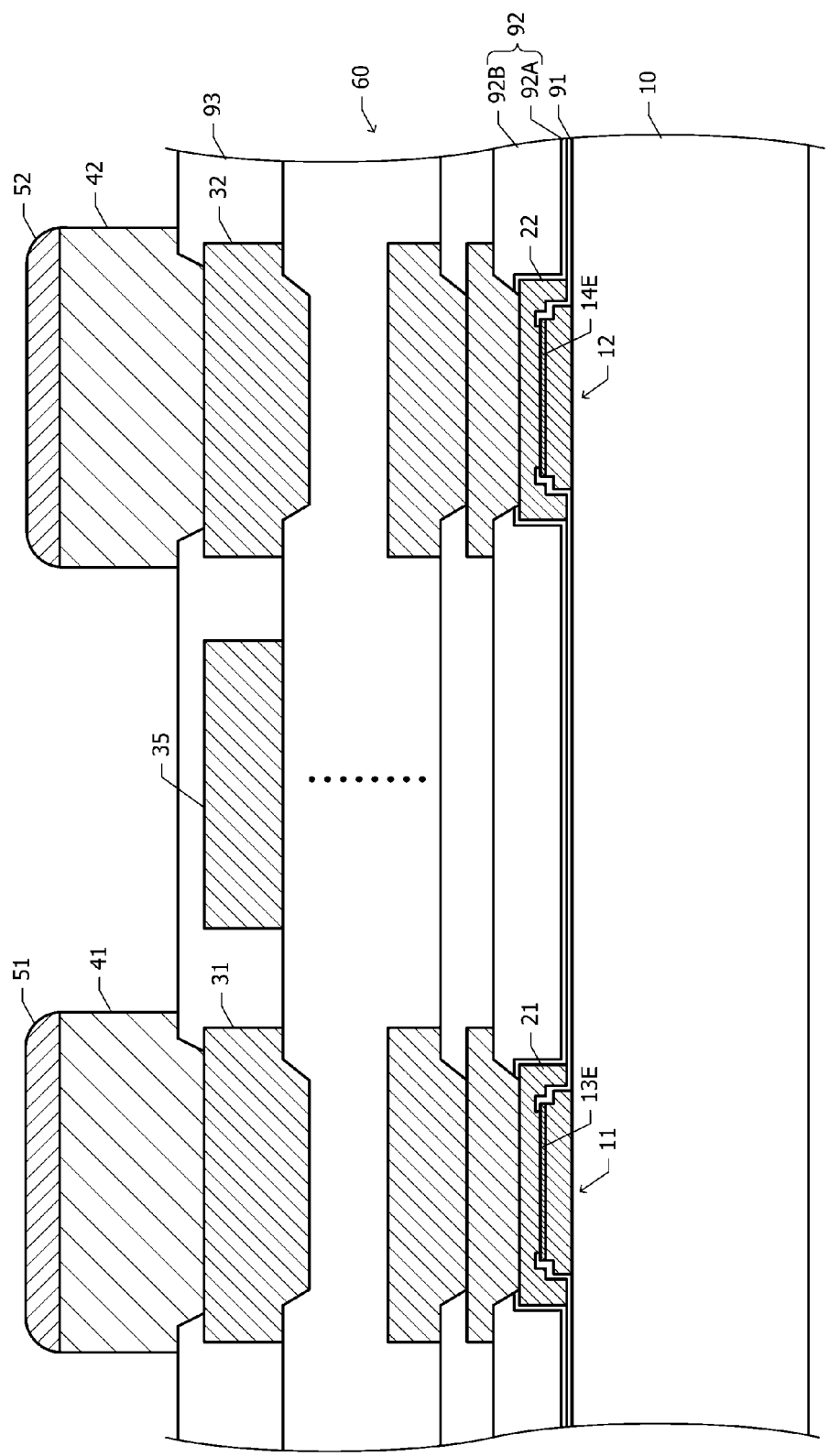
FIG. 5 is a sectional view of a semiconductor device according to another modification of the first embodiment.

Next, with reference to FIG. 5, a semiconductor device according to another modification of the first embodiment is described.

FIG. 5 is a sectional view of the semiconductor device according to the other modification of the first embodiment. In the first embodiment (FIG. 3), the single wiring layer including the first emitter wire 21 and the second emitter wire 22 is arranged between the emitter electrode 13E and the first pad 31 and between the emitter electrode 14E and the second pad 32. By contrast, in the modification depicted in FIG. 5, a multilayer wiring structure 60 including a plurality of wiring layers is arranged between the emitter electrode 13E and the first pad 31 and between the emitter electrode 14E and the second pad 32.

The first emitter wire 21 and the second emitter wire 22 are included in the wiring layer of the first layer counted from a substrate 10 side of the multilayer wiring structure 60. The first pad 31, the second pad 32, and the first metal pattern 35 are included in the uppermost wiring layer in the multilayer wiring structure 60. The first pad 31 and the second pad 32 are electrically connected to the emitter electrodes 13E and 14E, respectively, via the wiring layers in the multilayer wiring structure 60.

The uppermost wiring layer among the plurality of wiring layers in the multilayer wiring structure 60 may be referred to as a redistribution layer. The redistribution layer includes a wire for connecting a circuit on the substrate to terminals for external connection, for example, the first bump 41 and the second bump 42, and is provided mainly for the purpose of enhancing flexibility in arrangement of the terminals for external connection. Thus, the wire in the redistribution layer is connected generally to terminals for external connection, such as the first bump 41 and the second bump 42. In the modification, in this redistribution layer, the first metal pattern 35 not connected to any bump is arranged.

Normally, the wire in the redistribution layer is thicker than a wire in another wiring layer in the multilayer wiring structure 60. Thus, the first metal pattern 35 is thicker than any wire in another wiring layer arranged on a substrate side therefrom. By arranging, on the redistribution layer, the first metal pattern 35 having a large Young's modulus compared with the organic insulating material of the protective film 93, the effect of suppressing propagation of thermal stress from the module substrate to the first transistor 11 can be enhanced.

Note that if there is room to arrange a metal pattern in an area straight below the first metal pattern 35 of another wiring layer in the multilayer wiring structure 60, a metal pattern in a floating state may be arranged also on a wiring layer on a substrate side from the redistribution layer.

Next, a still another modification of the first embodiment is described. In the first embodiment, the mesa structure of the second transistor 12 is arranged straight below the second bump 42 (FIG. 3). As another structure, even if a mesa structure formed of a semiconductor is not arranged straight below the second bump 42, the first transistor 11 may receive an influence from the second bump 42 to cause a relatively large thermal stress to be applied to the end portion 11A (FIG. 1) of the first transistor 11 on a second bump 42 side. In this case, by arranging the first metal pattern 35, thermal stress can be decreased.

Second Embodiment

Figure 6:
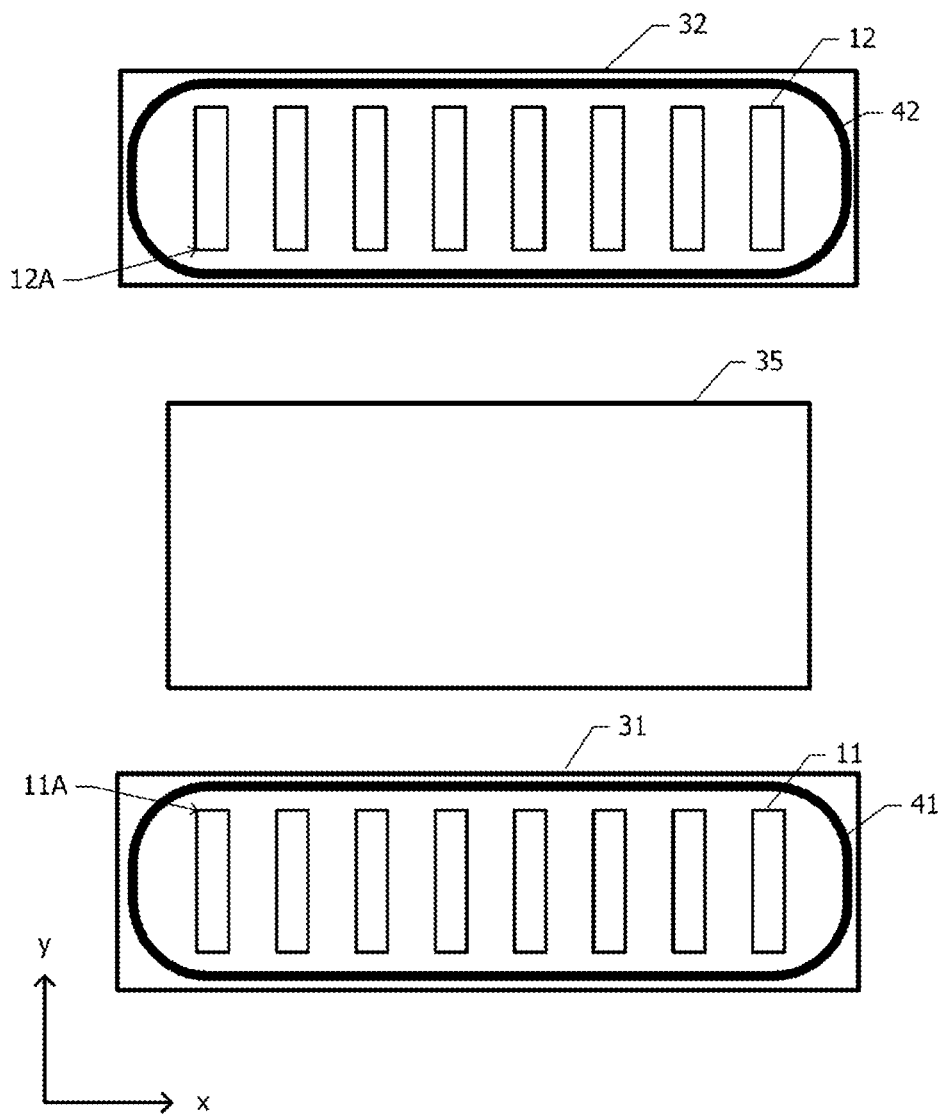
FIG. 6 is a diagram depicting a planar position relation among main components of a semiconductor device according to a second embodiment.

Next, with reference to FIG. 6, a semiconductor device according to a second embodiment is described. In the following, description of structures common to those of the semiconductor device according to the first embodiment (FIG. 1, FIG. 2, and FIG. 3) is omitted.

FIG. 6 is a diagram depicting a planar position relation among main components of the semiconductor device according to the second embodiment. In the first embodiment (FIG. 1), the shape of the second bump 42 in plan view is substantially circular. By contrast, in the second embodiment, the shape of the second bump 42 in plan view is a shape elongated in the x direction, which is similar to the first bump 41. That is, the longitudinal direction of the first bump 41 and the longitudinal direction of the second bump 42 are parallel to each other.

The plurality of second transistors 12 covered by the second bump 42 in plan view are arranged as aligned in the x direction. Each of the second transistors 12 has a shape elongated in the y direction in plan view, which is similar to the first transistor 11. The second pad 32 has a shape elongated in the x direction so as to cover the plurality of second transistors 12 in plan view. The first metal pattern 35 is arranged between the first bump 41 and the second bump 42.

Next, excellent effects of the second embodiment are described.

Also in the second embodiment, as with the first embodiment, since the first metal pattern 35 is arranged between the first bump 41 and the second bump 42, thermal stress at the end portion 11A of the first transistor 11 on the second bump 42 side can be decreased. Similarly, an effect of decreasing thermal stress at an end portion 12A of the second transistor 12 on the first bump 41 side can also be acquired. A preferable position relation between the second bump 42 and the first metal pattern 35 is identical to the preferable position relation between the first bump 41 and the first metal pattern 35 (FIG. 1) in the first embodiment.

Third Embodiment

Figure 7:
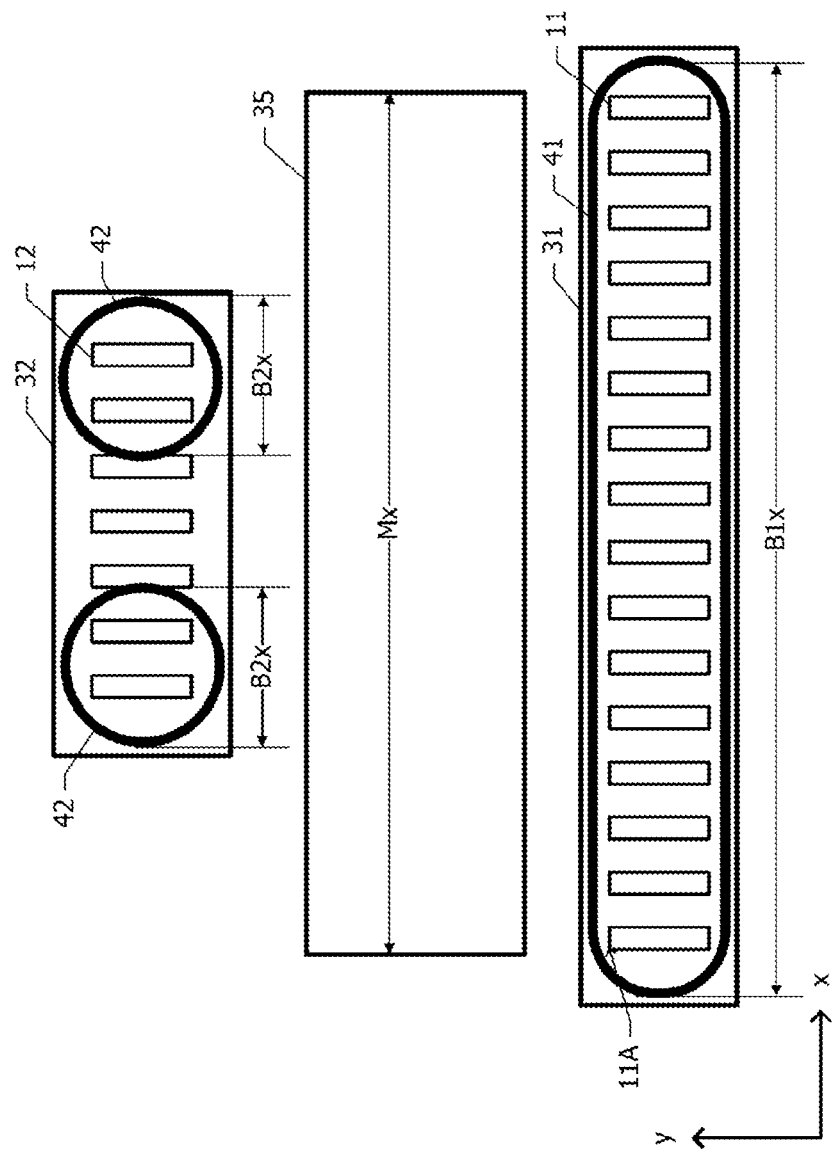
FIG. 7 is a diagram depicting a planar position relation among main components of a semiconductor device according to a third embodiment.

Next, with reference to FIG. 7, a semiconductor device according to a third embodiment is described. In the following, description of structures common to those of the semiconductor device according to the first embodiment (FIG. 1, FIG. 2, and FIG. 3) is omitted.

FIG. 7 is a diagram depicting a planar position relation among main components of the semiconductor device according to the third embodiment. In the first embodiment (FIG. 1), two second transistors 12 are arranged, and the shape of the second bump 42 connected to the second transistors 12 in plan view is substantially circular. By contrast, in the third embodiment, three or more, for example, seven second transistors 12 are arranged as aligned in the x direction.

Two second bumps 42 are arranged so as to have a space in the x direction. One second pad 32 continues from one second bump 42 to the other second bump 42 in plan view. The plurality of second transistors 12 are covered by the second pad 32 in plan view. The first metal pattern 35 is arranged between the first bump 41 and the two second bumps 42.

As to the x direction, the ranges B2$x$ where the two second bumps 42 are respectively arranged are covered by the range B1$x$ where the first bump 41 is arranged. Furthermore, as to the x direction, the ranges B2$x$ where the two second bumps 42 are respectively arranged are covered by the range M$x$ where the first metal pattern 35 is arranged.

Next, excellent effects of the third embodiment are described.

Also in the third embodiment, as with the first embodiment, since the first metal pattern 35 is arranged between the first bump 41 and the second bump 42, thermal stress at the end portion 11A of the first transistor 11 on the second bump 42 side can be decreased.

Next, a modification of the third embodiment is described.

In the third embodiment, while two second bumps 42 are arranged, the number of the plurality of second bumps 42 may be three or more. In this case, as to the x direction, the first metal pattern 35 is preferably arranged so that the ranges B2$x$ where the plurality of second bumps 42 are respectively arranged is covered by the range M$x$ where the first metal pattern 35 is arranged.

Fourth Embodiment

Figure 8:
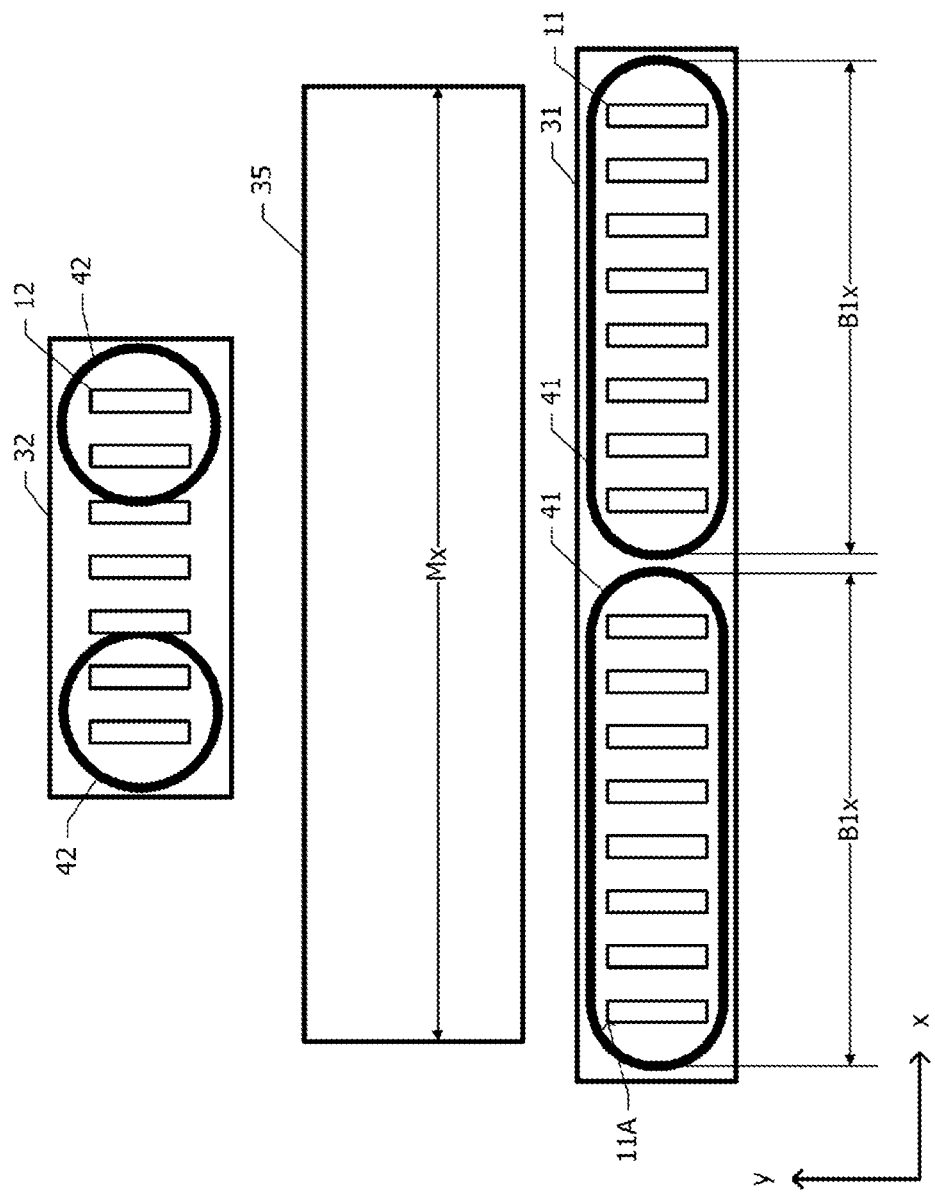
FIG. 8 is a diagram depicting a planar position relation among main components of a semiconductor device according to a fourth embodiment.

Next, with reference to FIG. 8, a semiconductor device according to a fourth embodiment is described. In the following, description of structures common to those of the semiconductor device according to the third embodiment (FIG. 7) is omitted.

FIG. 8 is a diagram depicting a planar position relation among main components of the semiconductor device according to the fourth embodiment. In the third embodiment (FIG. 7), one first bump 41 covering the plurality of first transistors 11 in plan view is arranged. By contrast, in the fourth embodiment, two first bumps 41 separated in the x direction are arranged. Part of the plurality of first transistors 11 among the plurality of first transistors 11 are covered by one first bump 41 in plan view, and the remaining plurality of first transistors 11 are covered by the other first bump 41 in plan view. The two first bumps 41 are arranged at the same position as to the y direction.

One first pad 31 extends from one first bump 41 to the other first bump 41 in x direction in plan view. The plurality of first transistors 11 are covered by the first pad 31 in plan view. One first metal pattern 35 is arranged between the two first bumps 41 and the two second bumps 42.

Next, excellent effects of the fourth embodiment are described.

Also in the fourth embodiment, as with the third embodiment, since the first metal pattern 35 is arranged between the first bumps 41 and the second bumps 42, thermal stress at the end portion 11A of the first transistor 11 on the second bump 42 side can be decreased. In this case, as to the x direction, the position and size of the first metal pattern 35 are preferably set so that an overlapping range of the range B1$x$ where one first bump 41 is arranged and the range M$x$ where the first metal pattern 35 is arranged occupies ½ or more of the range B1$x$ where the one first bump 41 is arranged. The same goes for the other first bump 41.

Next, a modification of the fourth embodiment is described. In the fourth embodiment, while two first bumps 41 separated in the x direction are arranged, the number of the plurality of first bumps 41 may be three or more. In this case, one first pad 31 is arranged so as to overlap all of the plurality of first bumps 41 in plan view.

Fifth Embodiment

Figure 9:
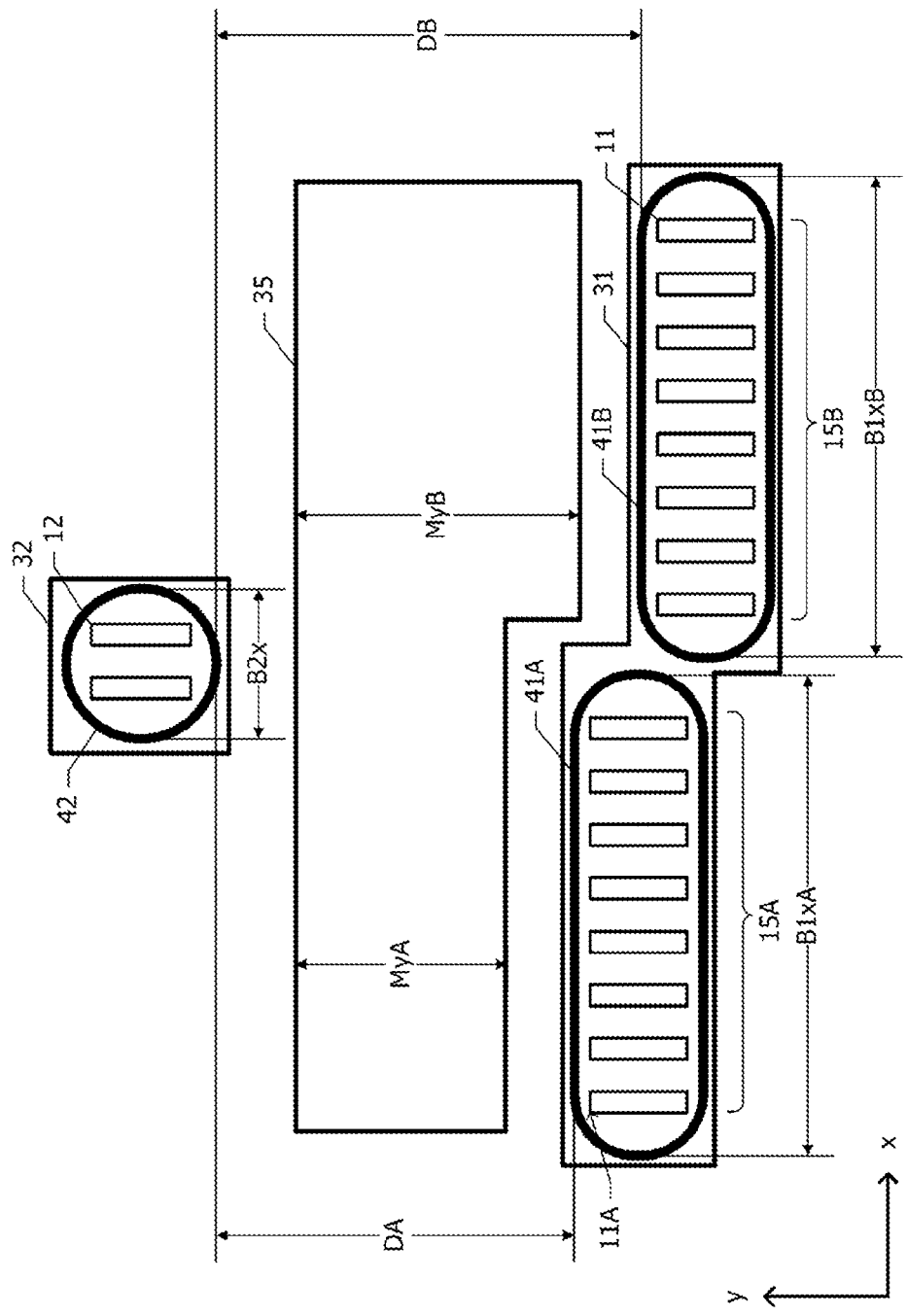
FIG. 9 is a diagram depicting a planar position relation among main components of a semiconductor device according to a fifth embodiment.

Next, with reference to FIG. 9, a semiconductor device according to a fifth embodiment is described. In the following, description of structures common to those of the semiconductor device according to the fourth embodiment (FIG. 8) is omitted.

FIG. 9 is a diagram depicting a planar position relation among main components of the semiconductor device according to the fifth embodiment. In the fourth embodiment (FIG. 8), the plurality of first transistors 11 are all arranged at the same position as to they direction. By contrast, in the fifth embodiment, the plurality of first transistors 11 of a first group 15A positioned on a negative side from a certain position in the x direction and the plurality of first transistors 11 of a second group 15B positioned on a positive side from the certain position are arranged as shifted in the y direction.

For the plurality of first transistors 11 of the first group 15A and the plurality of first transistors 11 of the second group 15B, the first bumps 41A and 41B are respectively arranged. The first pad 31 overlaps the two first bumps 41A and 41B in plan view. The first bump 41A corresponding to the first group 15A and the first bump 41B corresponding to the second group 15B are arranged as shifted in the y direction. Thus, a space DA between one first bump 41A and the second bump 42 in the y direction and a space DB between the other first bump 41B and the second bump 42 in the y direction are different from each other. For example, the space DA is narrower than the space DB.

The first metal pattern 35 is arranged between the one first bump 41A and the second bump 42 and between the other first bump 41B and the second bump 42. As to the x direction, the first metal pattern 35 continues from a range B1xA where the one first bump 41A is arranged to a range B1xB where the other first bump 41B is arranged. In each of the ranges B1xA and B1xB where the first bumps 41A and 41B are arranged, the first metal pattern 35 is arranged in ranges MyA and MyB as to the y direction.

In the range B1xA where the one first bump 41A is arranged, the range MyA where the first metal pattern 35 is arranged in the y direction occupies ½ or more of the space DA. Similarly, in the range B1xB where the other first bump 41B is arranged, the range MyB where the first metal pattern 35 is arranged in the y direction occupies ½ or more of the space DB.

When the plurality of first bumps 41 are arranged as shifted in the y direction as in the fifth embodiment, it is only required that the first metal pattern 35 is arranged at a preferable position for each of the plurality of first bumps 41 and the first metal pattern 35 arranged for the plurality of respective first bumps 41 is continued in the x direction.

Next, excellent effects of the fifth embodiment are described.

In the fifth embodiment, one first metal pattern 35 is arranged for the plurality of first bumps 41, and the first metal pattern 35 is arranged at a preferable position for each of the plurality of first bumps 41. Thus, thermal stress occurring at the end portions 11A of the first transistors 11 on the second bump 42 side arranged in the regions overlapping the plurality of respective first bumps 41 can be decreased.

Figure 10:
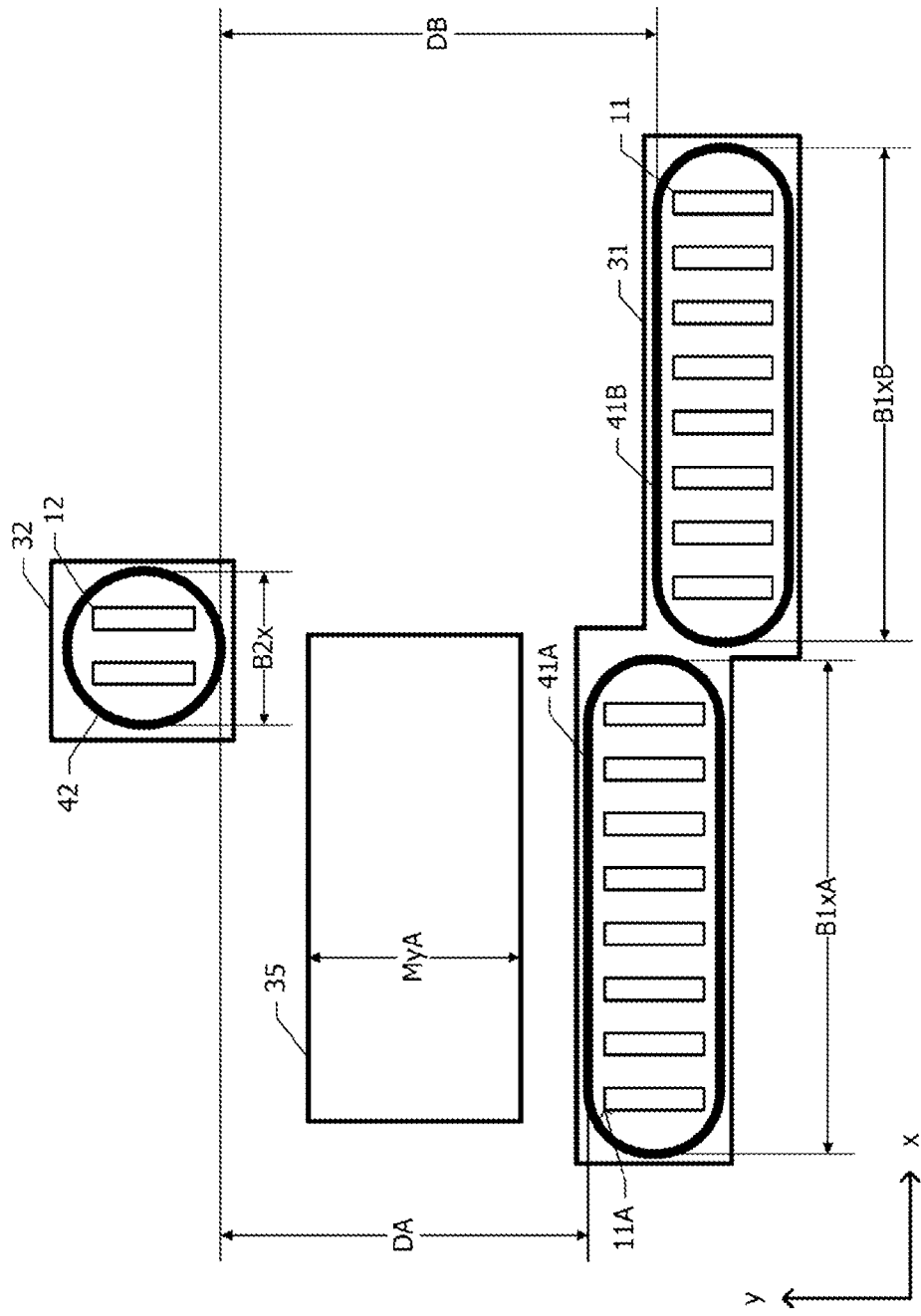
FIG. 10 is a diagram depicting a planar position relation among main components of a semiconductor device according to a modification of the fifth embodiment.

Next, with reference to FIG. 10, a semiconductor device according to a modification of the fifth embodiment is described.

FIG. 10 is a diagram depicting a planar position relation among main components of the semiconductor device according to the modification of the fifth embodiment. In the fifth embodiment (FIG. 9), the first metal pattern 35 is arranged for both of the two first bumps 41A and 41B. By contrast, in the present modification, while the first metal pattern 35 is arranged for the first bump 41A with a narrower space with respect to the second bump 42, the first metal pattern 35 is not arranged for the first bump 41B with a wider space.

The first transistors 11 straight below the first bump 41B which has a wider space with respect to the second bump 42 in the y direction of the two first bumps 41A and 41B less tend to receive an influence of thermal stress from the second bump 42 than the first transistors 11 straight below the first bump 41A with a narrower space. Thus, thermal stress occurring at the end portion 11A of each first transistor 11 straight below one first bump 41B is smaller than thermal stress occurring at the end portion 11A of each first transistor 11 straight below the other first bump 41A. A crack hardly occurs in the first transistors 11 straight below the first bump 41B with occurring thermal stress being relatively small. When sufficient reliability of the first transistors 11 straight below the first bump 41B can be ensured, as in the modification depicted in FIG. 10, as to the x direction, the first metal pattern 35 may not be arranged in the range B1xB where the first bump 41B is arranged.

Sixth Embodiment

Figure 11:
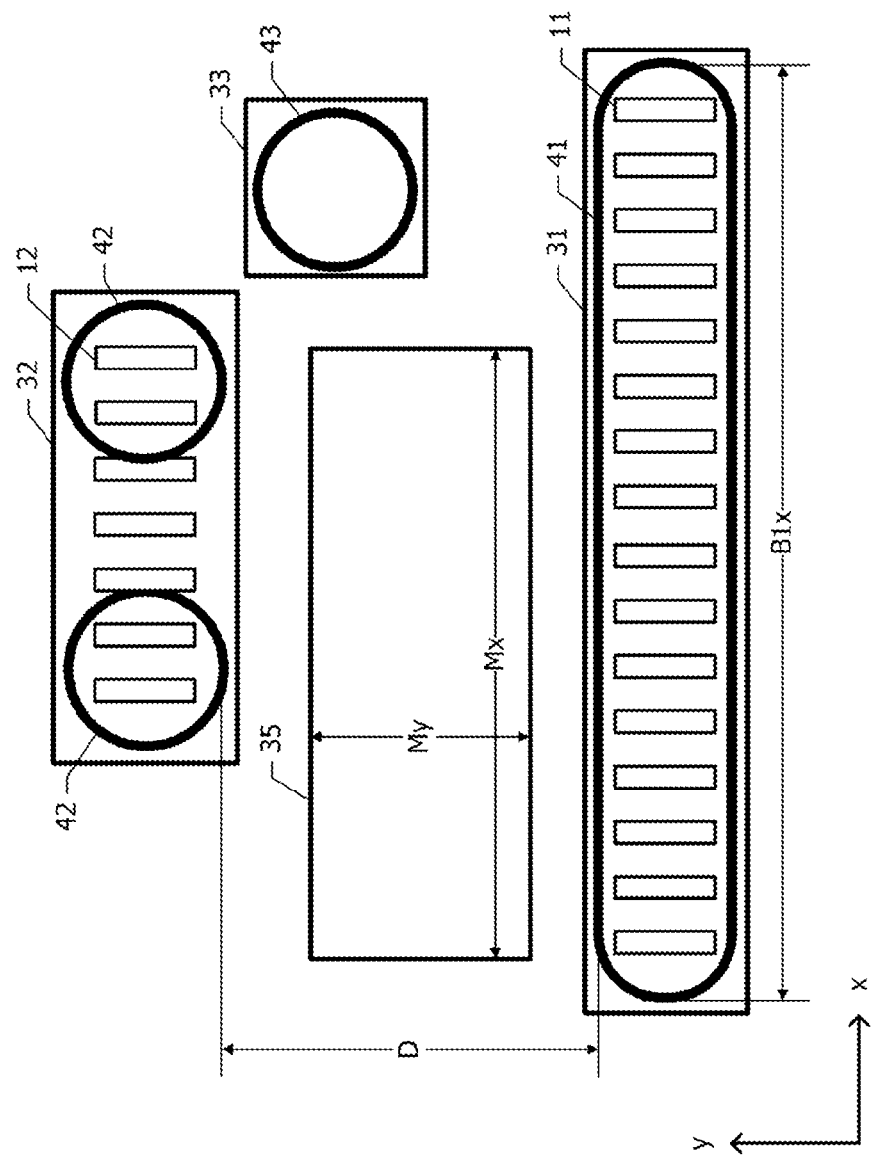
FIG. 11 is a diagram depicting a planar position relation among main components of a semiconductor device according to a sixth embodiment.

Next, with reference to FIG. 11, a semiconductor device according to a sixth embodiment is described. In the following, description of structures common to those of the semiconductor device according to the third embodiment (FIG. 7) is omitted.

FIG. 11 is a diagram depicting a planar position relation among main components of the semiconductor device according to the sixth embodiment. In the present modification, a third bump 43 is arranged between the first bump 41 and the second bump 42. A third pad 33 is arranged so as to overlap the third bump 43 in plan view. Straight below the third bump 43, no transistor is arranged. That is, in an area covered by the third bump 43 in plan view, no mesa structure of a semiconductor configuring a transistor is arranged, and the interlayer insulating film 92 (FIG. 2 and FIG. 3) of the second layer is in contact with the interlayer insulating film 91 (FIG. 2 and FIG. 3) of the first layer.

The influence of thermal stress to be received by the first transistors 11 straight below the first bump 41 from the third bump 43 without having a mesa structure straight therebelow is smaller than the influence of thermal stress to be received from the second bump 42 having a mesa structure straight therebelow. Thus, when the first metal pattern 35 is arranged, the position and shape of the first metal pattern 35 are preferably determined in consideration of the positions of the first bump 41 and the second bump 42.

For example, as to the x direction, the first metal pattern 35 is preferably arranged as avoiding the third bump 43 so that the range Mx where the first metal pattern 35 is arranged occupies ½ or more of the range B1x where the first bump 41 is arranged. As to the y direction, the first metal pattern 35 is preferably arranged so that the range My where the first metal pattern 35 is arranged occupies ½ or more of the space D.

Next, excellent effects of the sixth embodiment are described.

Also in the sixth embodiment, as with the third embodiment, it is possible to decrease thermal stress occurring at the end portion 11A of each of the plurality of first transistors 11 on the second bump 42 side arranged straight below the first bump 41. Since the influence of thermal stress from the third bump 43 without having a mesa structure of a semiconductor straight therebelow is small, the first metal pattern 35 may not be arranged between the first bump 41 and the third bump 43. Note that when the influence of thermal stress from the third bump 43 is large to the extent of influencing reliability, the first metal pattern 35 may be arranged between the first bump 41 and the third bump 43.

Seventh Embodiment

Figure 12:
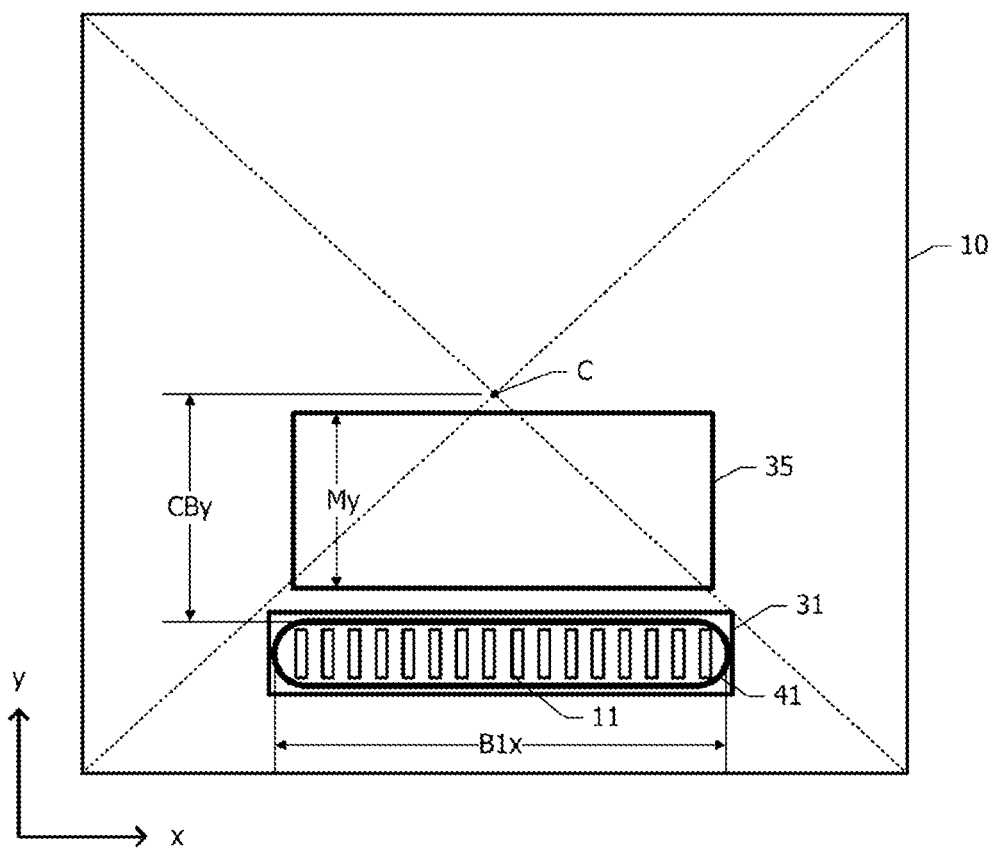
FIG. 12 is a diagram depicting a planar position relation among main components of a semiconductor device according to a seventh embodiment.

Next, with reference to FIG. 12, a semiconductor device according to a seventh embodiment is described. In the following, description of structures common to those of the semiconductor device according to the first embodiment (FIG. 1, FIG. 2, and FIG. 3) is omitted.

FIG. 12 is a diagram depicting a planar position relation among main components of the semiconductor device according to the seventh embodiment. In the first embodiment (FIG. 1), the second bump 42 is arranged so as to have a space from the first bump 41 in the y direction. By contrast, in the seventh embodiment, other than the first bump 41, a bump where a mesa structure of a semiconductor is arranged straight therebelow is not arranged.

The first bump 41 is arranged at a position out of a geometric center C of the substrate 10 in plan view. Furthermore, an area obtained by extending the first bump 41 in its longitudinal direction is also out of the geometric center C. Also, as to the x direction, the geometric center C is positioned in the range B1x where the first bump 41 is arranged. In plan view, in an area on a side of a geometric center C from the first bump 41, the first metal pattern 35 is arranged so as to have a space from the first bump 41.

As with the semiconductor device (FIG. 3) according to the first embodiment, when the upper surface of the substrate 10 is taken as a height reference, the height of the center of the first metal pattern 35 in the thickness direction is higher than the upper surface of the mesa structure of each of the first transistors 11 and the second transistors 12 and is lower than the lower surface of each of the first bump 41 and the second bump 42.

Next, excellent effects of the seventh embodiment are described.

According to simulations conducted by the inventors of the present application, it turned out that stress applied to the first transistor 11 straight below the first bump 41 elongated in one direction is relatively large at the end portion 11A on the geometric center C side. In the seventh embodiment, by arranging the first metal pattern 35 in the area on the geometric center C side from the first bump 41, thermal stress applied to the first transistor 11 can be decreased.

To acquire a sufficient effect of decreasing thermal stress, as to the y direction, the first metal pattern 35 is preferably arranged so that the overlapping range of the space CBy from the first bump 41 to the geometric center C and the range My where the first metal pattern 35 is arranged occupies ½ or more of the space CBy.

Each of the above-described embodiments is an example, and it goes without saying that partial replacement or combination of structures described in different embodiments is possible. Similar operations and effects by similar structures in a plurality of embodiments are not mentioned one by one. Furthermore, the present disclosure is not limited to the above-described embodiments. For example, it would be evident for a person skilled in the art that various modifications, improvements, combinations, and so forth are possible.

What is claimed is:

1. A semiconductor device comprising:
    a substrate;
    a plurality of first transistors each including a mesa structure configured of a semiconductor arranged on an upper surface, which is one surface of the substrate;
    a first bump which is arranged at a position overlapping the plurality of first transistors in plan view, has a shape elongated in one direction in plan view, and is connected to the plurality of first transistors;
    a second bump which is arranged so as to have a space with respect to the first bump in a direction orthogonal to a longitudinal direction of the first bump; and
    a first metal pattern which is arranged between the first bump and the second bump in plan view, wherein
    when the upper surface of the substrate is taken as a height reference, a center of the first metal pattern in a thickness direction has a height higher than an upper surface of the mesa structure included in each of the plurality of first transistors and lower than a lower surface of the first bump.

2. The semiconductor device according to claim 1, further comprising:
    a multilayer wiring structure which is arranged on the substrate and the plurality of first transistors and includes a plurality of wiring layers, wherein
    the first bump and the second bump are in contact with a metal pattern of an uppermost wiring layer in the multilayer wiring structure, and the first metal pattern is arranged on the uppermost wiring layer in the multilayer wiring structure.

3. The semiconductor device according to claim 1, wherein
    as to the longitudinal direction of the first bump, the first metal pattern is arranged to occupy a range that is ½ or more of a range where the first bump is arranged.

4. The semiconductor device according to claim 1, wherein
    as to the direction orthogonal to the longitudinal direction of the first bump, the first metal pattern occupies a range that is ½ or more of a space between the first bump and the second bump.

5. The semiconductor device according to claim 1, further comprising:
    at least one second transistor which is arranged at a position overlapping the second bump in plan view, wherein
    the second transistor includes a mesa structure configured of a semiconductor arranged on the upper surface of the substrate.

6. The semiconductor device according to claim 5, wherein
    a plurality of said second transistors are arranged as aligned in a direction parallel to the longitudinal direction of the first bump, and
    the second bump has a shape elongated in the direction parallel to the longitudinal direction of the first bump in plan view.

7. The semiconductor device according to claim 2, wherein
    as to the longitudinal direction of the first bump, the first metal pattern is arranged to occupy a range that is ½ or more of a range where the first bump is arranged.

8. The semiconductor device according to claim 2, wherein
    as to the direction orthogonal to the longitudinal direction of the first bump, the first metal pattern occupies a range that is ½ or more of a space between the first bump and the second bump.

9. The semiconductor device according to claim 3, wherein
    as to the direction orthogonal to the longitudinal direction of the first bump, the first metal pattern occupies a range that is ½ or more of a space between the first bump and the second bump.

10. The semiconductor device according to claim 7, wherein
    as to the direction orthogonal to the longitudinal direction of the first bump, the first metal pattern occupies a range that is ½ or more of a space between the first bump and the second bump.

11. The semiconductor device according to claim 2, further comprising:
    at least one second transistor which is arranged at a position overlapping the second bump in plan view, wherein
    the second transistor includes a mesa structure configured of a semiconductor arranged on the upper surface of the substrate.

12. The semiconductor device according to claim 3, further comprising:
    at least one second transistor which is arranged at a position overlapping the second bump in plan view, wherein the second transistor includes a mesa structure configured of a semiconductor arranged on the upper surface of the substrate.

13. The semiconductor device according to claim 4, further comprising:
at least one second transistor which is arranged at a position overlapping the second bump in plan view, wherein
the second transistor includes a mesa structure configured of a semiconductor arranged on the upper surface of the substrate.

14. The semiconductor device according to claim 7, further comprising:
at least one second transistor which is arranged at a position overlapping the second bump in plan view, wherein
the second transistor includes a mesa structure configured of a semiconductor arranged on the upper surface of the substrate.

15. A semiconductor device comprising:
a substrate;
a plurality of first transistors each including a mesa structure configured of a semiconductor arranged on an upper surface, which is one surface of the substrate; and
a first bump which is arranged at a position overlapping the plurality of first transistors in plan view, has a shape elongated in one direction in plan view, and is connected to the plurality of first transistors, wherein
the first bump and an area obtained by extending the first bump in a longitudinal direction are out of a geometric center of the substrate in plan view,
the semiconductor device further includes a first metal pattern which is arranged in an area on a side of the geometric center from the first bump so as to have a space from the first bump in plan view, and
when the upper surface of the substrate is taken as a height reference, a center of the first metal pattern in a thickness direction has a height higher than an upper surface of the mesa structure included in each of the plurality of first transistors and lower than a lower surface of the first bump.

16. The semiconductor device according to claim 15, wherein
as to a direction orthogonal to the longitudinal direction of the first bump, an overlapping range of a space from the first bump to the geometric center and a range where the first metal pattern is arranged occupies ½ or more of the space from the first bump to the geometric center.

17. A semiconductor device comprising:
a substrate;
a plurality of first transistors each including a mesa structure configured of a semiconductor arranged on an upper surface, which is one surface of the substrate;
a first bump which is arranged at a position overlapping the plurality of first transistors in plan view, has a shape elongated in one direction in plan view, and is connected to the plurality of first transistors;
a second bump which is arranged so as to have a space with respect to the first bump in a direction orthogonal to a longitudinal direction of the first bump; and
a first metal pattern which is arranged between the first bump and the second bump in plan view, wherein
when the upper surface of the substrate is taken as a height reference, a center of the first metal pattern in a thickness direction has a height higher than an upper surface of the mesa structure included in each of the plurality of first transistors and lower than a lower surface of the first bump, and
as to the longitudinal direction of the first bump, the first metal pattern occupies a range that is ½ or more of a range where the first bump is arranged.

18. The semiconductor device according to claim 17, further comprising:
a multilayer wiring structure which is arranged on the substrate and the plurality of first transistors and includes a plurality of wiring layers, wherein
the first bump and the second bump are in contact with a metal pattern of an uppermost wiring layer in the multilayer wiring structure, and the first metal pattern is arranged on the uppermost wiring layer in the multilayer wiring structure.

19. The semiconductor device according to claim 17, wherein
as to the direction orthogonal to the longitudinal direction of the first bump, the first metal pattern occupies a range that is ½ or more of a space between the first bump and the second bump.

20. The semiconductor device according to claim 18, wherein
as to the direction orthogonal to the longitudinal direction of the first bump, the first metal pattern occupies a range that is ½ or more of a space between the first bump and the second bump.

* * * * *